(12) United States Patent
Seki

(10) Patent No.: US 6,563,335 B2
(45) Date of Patent: May 13, 2003

(54) SEMICONDUCTOR DEVICE AND TEST METHOD THEREFOR

(75) Inventor: Hiroshi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/971,921

(22) Filed: Oct. 9, 2001

(65) Prior Publication Data

US 2002/0044053 A1 Apr. 18, 2002

(30) Foreign Application Priority Data

Oct. 18, 2000 (JP) ........................................ 2000-317496

(51) Int. Cl.[7] .............................................. H03K 19/00
(52) U.S. Cl. ................................ 326/16; 326/9; 326/14
(58) Field of Search ............................. 326/9, 14, 16, 326/101

(56) References Cited

U.S. PATENT DOCUMENTS 5,578,938 A * 11/1996 Kazami
6,239,611 B1 * 5/2001 Matera ........................ 326/16

* cited by examiner

*Primary Examiner*—Michael Tokar
*Assistant Examiner*—Anh Q Tran
(74) *Attorney, Agent, or Firm*—Oliff & Berridge, PLC

(57) ABSTRACT

A semiconductor device and a test method therefor can perform delay evaluation without depending on a chip size and a measuring unit. An input I/O circuit and an output I/O circuit are disposed on a semiconductor chip of a semiconductor device. A test cell including a delay evaluation circuit is disposed in a basic cell area of the chip core portion of the semiconductor chip. The test cell includes a first delay circuit which has plural stages of inverters connected to one another only by a first interconnect layer and a delay evaluation switching circuit. The test cell can be switched between a first measurement mode for measuring a delay time between the input I/O circuit and the output I/O circuit via a through path and a second measurement mode for measuring a delay time between the input I/O circuit and the output I/O circuit via the first delay circuit.

15 Claims, 11 Drawing Sheets

FIG. 8

| SAMPLE | TESTER MEASUREMENT [ps] | MANUAL MEASUREMENT [ps] |
|---|---|---|
| 1 | 85.53 | 85.5 |
| 2 | 85.94 | 85.8 |
| 3 | 86.46 | 86.5 |
| 4 | 86.98 | 86.8 |
| 5 | 87.05 | 87.1 |
| 6 | 86.55 | 86.5 |
| 7 | 85.98 | 85.9 |
| 8 | 86.32 | 86.1 |
| 9 | 86.44 | 86.3 |
| 10 | 86.59 | 86.6 |

SEMICONDUCTOR DEVICE AND TEST METHOD THEREFOR

Japanese Patent Application No. 2000-317496, filed on Oct. 18, 2000, is hereby incorporated by reference in its entirety.

TECHNICAL FIELD

The present invention relates to a semiconductor device and a test method therefor, and, more particularly, to a semiconductor device and a test method therefor which are suitable for an application specific integrated circuit including a circuit designed by a user.

BACKGROUND

Development on application specific integrated circuits (ASICs) is carried out by using development tools, which have been built by a chip maker, with basic cells prepared by the chip maker as structural units to achieve specifications peculiar to a user. As such ASICs can significantly contribute to reducing the number of components of a user product, demands for ASICs are increasing.

In developing an ASIC, a user makes logic design that achieves, for example, desired functions, provides a chip maker with designed circuit diagrams and a test pattern for verifying whether the functions are as designed or not and asks the chip maker to make a layout design, execute mask fabrication and so forth. Alternatively, the user completes a process up to making of the layout design, provides the chip maker with layout data that has been verified to operate with specified AC characteristics by development tools or the like and a test pattern and asks the chip maker to execute mask fabrication and so forth.

An ASIC developed in this manner is normally provided with a test circuit which allows a chip maker to determine if the ASIC passes. After manufacturing chips using fabricated masks, the chip maker sorts out defective chips by checking if the chips pass or fail using the test pattern provided by the user and through a test conducted by the test circuit.

SUMMARY

One aspect of the present invention relates to a semiconductor device including a test cell for performing delay evaluation of a signal input from a first I/O circuit and output to a second I/O circuit, the semiconductor device comprising:

first to N-th delay paths for respectively delaying a signal input from the first I/O circuit by first to N-th delay values different from one another and for outputting the delayed signal to the second I/O circuit; and a delay path switching circuit that selects one of the first to N-th delay paths through which a signal input from the first I/O circuit is output to the second I/O circuit.

Another aspect of the present invention relates to a test method for a semiconductor device including first and second I/O circuits and first to N-th delay paths, which are provided between the first and second I/O circuits, for respectively delaying a signal by first to N-th delay values different from one another, the method comprising steps of:

measuring first to N-th delay times between a signal input from the first I/O circuit and a signal output to the second I/O circuit being output via each of the first to N-th delay paths corresponding to the input signal for each of the first to N-th delay paths; and testing the semiconductor device based on a difference between at least two of the first to N-th delay times.

BRIEF DESCRIPTION OF THE DRAWINGS

FIG. 8 is an explanatory diagram showing measuring results for each unit of the first delay circuit as adapted to the semiconductor device according to the first embodiment;

DETAILED DESCRIPTION

Figure 1:
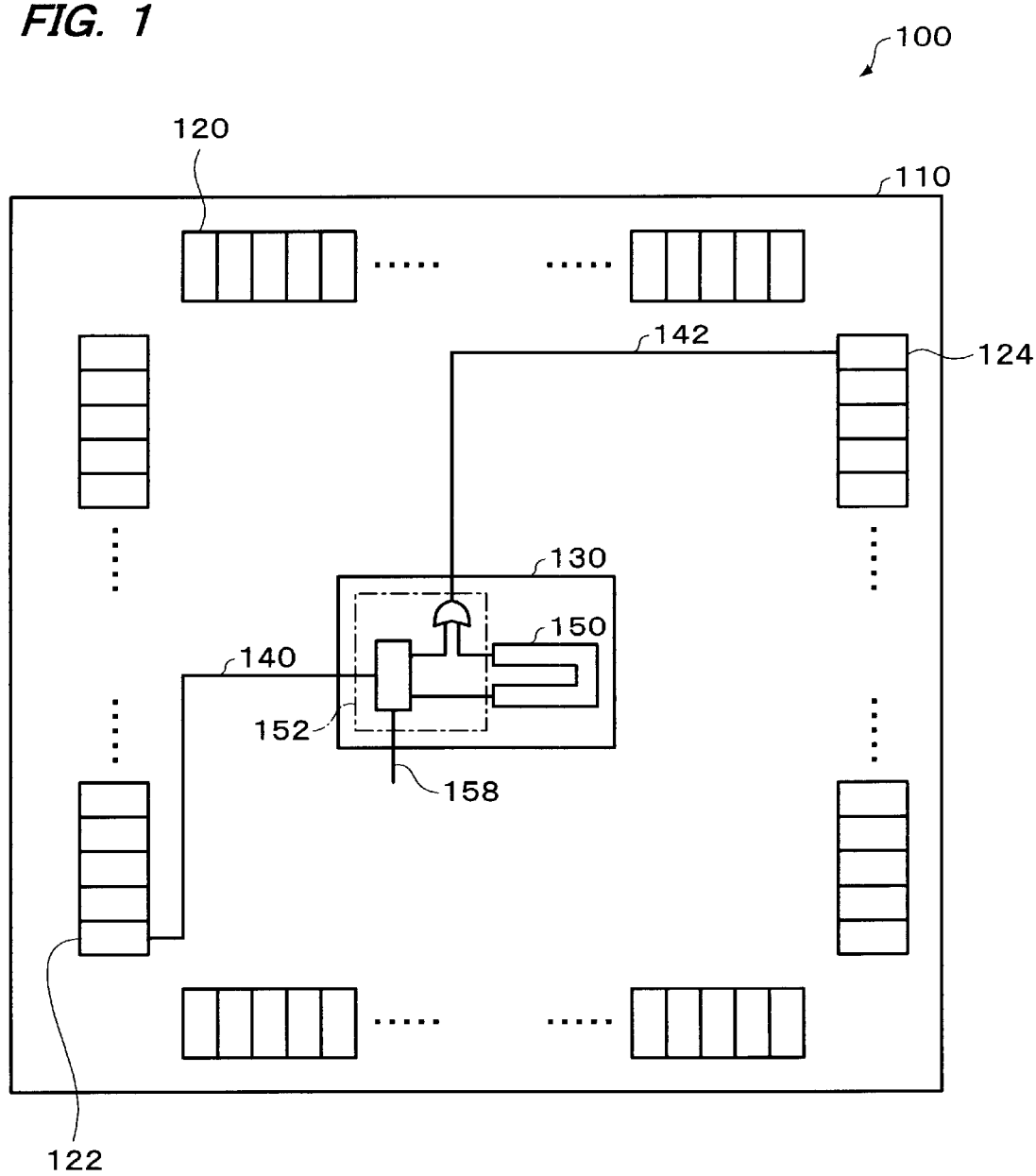
FIG. 1 is an explanatory diagram schematically illustrating one example of the layout of a chip of a semiconductor device according to a first embodiment.

Embodiments of the present invention are described below.

The embodiments to be discussed below in no way restrict the subject matters of the present invention recited in the appended claims. Not all the structural elements of the embodiments that will be discussed hereunder are essential to the present invention.

One example of a test circuit that is added by a chip maker is a delay evaluation circuit for evaluating the delay of a signal. The delay evaluation circuit includes a delay element.

An input I/O circuit is connected to the input section of the delay evaluation circuit and an output I/O circuit to the output section thereof. The input I/O circuit includes a pad corresponding to a signal-input external terminal of a semiconductor device and an input interface circuit electrically connected to the pad. The output I/O circuit includes a pad corresponding to a signal-output external terminal of the semiconductor device and an output interface circuit electrically connected to the pad. In sorting out chips according to the related art, such a delay evaluation circuit is used to measure the delay time from the input I/O circuit to the output I/O circuit and whether each chip passes or fails is determined in accordance with the measuring results.

However, the measured value of the delay time from the input I/O circuit to the output I/O circuit of a chip to be checked may not be the delay time of the delay evaluation circuit that should originally be evaluated, but vary significantly depending on, for example, a variation in a measuring unit, such as a variation in semiconductor testers in use, a variation in probe cards, a variation in performance boards, a variation in a load capacitor to be added to the output I/O circuit or the waveform distortion of the signal input to the input I/O circuit.

Therefore, a margin was normally given to the measuring results from the delay evaluation circuit to eliminate the dependency of those various factors. Because there are many factors that should be considered in delay evaluation, however, the margin lowers the reliability of the measured values that should originally be evaluated. This may result in erroneous discrimination of proper chips as defects, thus leading to an increase in the chip manufacturing cost.

As ASICs are designed by automatic placement and routing tools, placement and routing are performed with certain restrictions on such a test circuit. However, a difference in chip size and the layout of a specific I/O circuit that should be employed according to the user specifications require that the delay value to be evaluated should be computed every time an ASIC is designed. This increases the number of development steps.

The embodiments of the present invention have been devised to overcome the technical shortcomings and aims at providing a semiconductor device and a test method therefor that can perform delay evaluation which does not depend on the chip size and the measuring unit.

A semiconductor device according to one embodiment of the present invention includes a test cell for performing delay evaluation of a signal input from a first I/O circuit and output to a second I/O circuit, and comprises: first to N-th delay paths for respectively delaying a signal input from the first I/O circuit by first to N-th delay values different from one another and for outputting the delayed signal to the second I/O circuit; and a delay path switching circuit that selects one of the first to N-th delay paths through which a signal input from the first I/O circuit is output to the second I/O circuit.

Each of the first and second I/O circuits has only to include an I/O cell having an electric interface capability and an electrode pad but should not necessarily include an external terminal of the semiconductor device.

The first to N-th delay paths may simply be interconnects or may be constructed by various delay elements, as long as they can delay the input signal from the first I/O circuit by respective delay values different from one another.

According to this embodiment, the semiconductor device is provided with the first to N-th delay paths one of which is selected by the delay path switching circuit at the time the input signal from the first I/O circuit is output to the second I/O circuit. Based on the difference between delay signals that go through delay paths which generate different delay values, therefore, delay evaluation with higher reliability can be executed due to the difference between the delay values.

In this embodiment, an i-th delay path ("i" being a natural number equal to or greater than 1 and equal to or smaller than N) may include a delay element and a given interconnect layer, and a j-th delay path ("j" being a natural number equal to or greater than 1 and equal to or smaller than N but excluding i) may not include a delay element but includes the given interconnect layer.

Here, the "delay element" includes, for example, a plurality of inverters (buffer circuits in a broad sense) and delays the input signal by a delay value corresponding to a given process condition.

The "given interconnect layer" is an interconnect layer for electrically connecting transistors or the like that constitute the semiconductor device, and is not limited to the type of the interconnect layer.

According to the semiconductor device of this embodiment, therefore, two different delay paths, namely the i-th delay path which includes a delay element and a given interconnect layer and the j-th delay path which does not include a delay element but includes the given interconnect layer, can be provided so that the difference between the delay values provided by those paths becomes the delay value of the delay element. This structure can allow the difference between the delay time between the first and second I/O circuits via the i-th delay path and the delay time between the first and second I/O circuits via the j-th delay path to cancel out the delay times from the first I/O circuit to the i-th and j-th delay paths and the delay times from the i-th and j-th delay paths to the second I/O circuit, so that the pure delay time of the delay element remains. This means that it is possible to cancel out the delay times which are provided by the first and second I/O circuits, the lengths of the interconnects to be connected to both I/O circuits and the parasitic capacitors of the interconnects and the inherent influence of a measuring unit which varies the signal waveform to be input to the first I/O circuit and the load capacitor to be added to the second I/O circuit. This can ensure delay evaluation that does not depend on the lengths of the interconnects from the measuring unit to delay paths, i.e., the chip size, but depends only on the fabrication process.

In this embodiment, the i-th delay path may be disposed in such a manner that an input section and an output section of the delay element may be positioned close to each other.

As the input section and the output section of the i-th delay path are positioned close to each other according to this embodiment, the difference between the length of the interconnect via the i-th delay path and the length of the interconnect via the j-th delay path can be equal to the length of the interconnect via the i-th delay path. Therefore, the difference between the delay times via the i-th and j-th delay paths becomes just the delay value provided by the pure delay element. This can ensure more reliable calculation of the difference between different delay times and precise delay evaluation.

In this embodiment, a k-th delay path ("k" being a natural number equal to or greater than 1 and equal to or smaller than N but excluding i and j) may comprise a delay element that includes at least a plurality of interconnect layers including the given interconnect layer, and a contact for electrically connecting the plurality of interconnect layers.

The "contact" is something to electrically connect interconnect layers that are disposed on different layers, and are normally contact resistors added.

Because the i-th delay path and the k-th delay path provide delay values which differ from each other by the interconnect layer that is connected to a given interconnect layer via a contact, therefore, whether or not a problem has occurred in the process in a layer, for example, overlying the given interconnect layer can be monitored by connecting an interconnect layer overlying the given interconnect layer via a contact and checking the difference between the delay times of those delay paths. It is possible to easily analyze whether the factor leading to, for example, discrimination of the semiconductor device as a defect lies in the chip or in the process. Further, feedback of the monitoring results to the process control can improve the yield of chips under stable fabrication conditions.

In this embodiment, the k-th delay path may be disposed in such a manner that an input section and an output section of the delay element are positioned close to each other.

As the input section and the output section of the k-th delay path are positioned close to each other according to this embodiment, the difference between the length of the interconnect via the k-th delay path and the length of the interconnect via the j-th delay path can be equal to the length of the interconnect via the k-th delay path. Therefore, the difference between the delay times via the k-th and j-th delay paths becomes just the delay value provided by a plurality of interconnect layers included in the pure delay element and the contact that connect those interconnect layers. With regard to the influence of the interconnect layers, it is possible to ensure more reliable calculation of the difference between different delay times and precise delay evaluation.

In this embodiment, the delay element may include first to M-th buffer circuits and may be disposed in such a manner that an m-th buffer circuit (m being a natural number equal to or greater than 1 and equal to or smaller than (M−1)) is connected to an (m+1)-th buffer circuit and an input section of the first buffer circuit and an output section of the M-th buffer circuit are positioned close to each other.

The "buffer circuits" may be a plurality of inverters.

As the input section of the first buffer circuit and the output section of the M-th buffer circuit are positioned close to each other according to this embodiment, arranging plural stages of buffer circuits in a folded manner eliminates the need for consideration of the interconnecting delay between the input section and the output section of the delay element and can improve the precision of delay evaluation.

A test method for a semiconductor device according to another embodiment of includes first and second I/O circuits and first to N-th delay paths, which are provided between the first and second I/O circuits, for respectively delaying a signal by first to N-th delay values different from one another, and comprises steps of: measuring first to N-th delay times between a signal input from the first I/O circuit and a signal output to the second I/O circuit being output via each of the first to N-th delay paths corresponding to the input signal for each of the first to N-th delay paths; and testing the semiconductor device based on a difference between at least two of the first to N-th delay times.

According to this embodiment, at the time of testing a semiconductor device having a plurality of delay paths which produce delay values different from one another, a delay time via a delay path selected from different delay paths is measured plural times and the difference between the delay time and another delay time, which appears as the difference between the causes for the difference between delay values, is computed to be compared with the delay value that should originally be computed. This can ensure more reliable delay evaluation.

According to the semiconductor device test method of this embodiment, an i-th delay path ("i" being a natural number equal to or greater than 1 and equal to or smaller than N) may include a delay element and a given interconnect layer, and a j-th delay path ("j" being a natural number equal to or greater than 1 and equal to or smaller than N but excluding i) may not include a delay element but includes the given interconnect layer.

As the difference between the delay values that are produced by the i-th delay path and the j-th delay path becomes the delay value of the delay element in the test method of this embodiment, the difference between the delay time between the first and second I/O circuits via the i-th delay path and the delay time between the first and second I/O circuits via the j-th delay path cancels out the delay times from the first I/O circuit to the i-th and j-th delay paths and the delay times from the i-th and j-th delay paths to the second I/O circuit, so that the pure delay time of the delay element remains. This can ensure delay evaluation that does not depend on the lengths of the interconnects from the measuring unit to delay paths, i.e., the chip size but depends only on the fabrication process.

In the semiconductor device test method of this embodiment, the i-th delay path may be disposed in such a manner that an input section and an output section of the delay element are positioned close to each other.

As the input section and the output section of the i-th delay path are positioned close to each other according to this embodiment, the difference between the length of the interconnect via the i-th delay path and the length of the interconnect via the j-th delay path can be equal to the length of the interconnect via the i-th delay path. Therefore, the difference between the delay times via the i-th and j-th delay paths becomes just the delay value provided by the pure delay element of the i-th delay path. This can ensure more reliable calculation of the difference between different delay times and precise delay evaluation.

In the semiconductor device test method of this embodiment, a k-th delay path ("k" being a natural number equal to or greater than 1 and equal to or smaller than N but excluding i and j) may comprise a delay element that includes at least a plurality of interconnect layers including the given interconnect layer, and a contact for electrically connecting the plurality of interconnect layers.

According to this embodiment, delay paths differ from each other in the provision of another interconnect layer that is connected to the given interconnect layer via a contact, whether or not a problem has occurred in the process in a layer, for example, overlying the given interconnect layer can be monitored by connecting an interconnect layer overlying the given interconnect layer via a contact and checking the difference between the delay times of those delay paths.

In the semiconductor device test method of this embodiment, the k-th delay path may be disposed in such a manner that an input section and an output section of the delay element are positioned close to each other.

As the input section and the output section of the k-th delay path are positioned close to each other according to this embodiment, the difference between the length of the interconnect via the k-th delay path and the length of the interconnect via the j-th delay path can be equal to the length of the interconnect via the k-th delay path. Therefore, the difference between the delay times via the k-th and j-th delay paths becomes just the delay value provided by a plurality of interconnect layers included in the delay element of the k-th delay path and the contact that connect those interconnect layers. With regard to the influence of the interconnect layers, it is possible to ensure more reliable calculation of the difference between different delay times and precise delay evaluation.

In the semiconductor device test method of this embodiment, the delay element may include first to M-th buffer circuits and may be disposed in such a manner that an m-th buffer circuit (m being a natural number equal to or greater than 1 and equal to or smaller than (M−1)) is connected to an (m+1)-th buffer circuit and an input section of the first buffer circuit and an output section of the M-th buffer circuit are positioned close to each other.

As the input section of the first buffer circuit and the output section of the M-th buffer circuit are positioned close to each other according to this embodiment, this eliminates the need for consideration of the interconnecting delay between the input section and the output section of the delay element and can improve the precision of delay evaluation.

Embodiments of the present invention are elaborated below with reference to the accompanying drawings.

First Embodiment

The first embodiment is described below referring to FIGS. 1 through 5.

FIG. 1 schematically illustrates one example of the layout of a chip of a semiconductor device according to the first embodiment.

As shown in FIG. 1, a semiconductor device 100 according to the first embodiment includes a semiconductor chip 110 which has circuit elements integrated on a substrate of silicon or the like and unillustrated connection terminals which are to be electrically connected to pads of the semiconductor chip 110.

I/O circuits 120 including pads or electrodes to electrically connect to the unillustrated connection terminals of the semiconductor device 100 and I/O cells having an electric interface capability between the individual pads and basic cells inside the chip are disposed at the peripheral portion of the semiconductor chip 110 in association with those connection terminals. Each of the I/O cells included in the I/O circuit 120 is comprised of an input I/O cell when the associated connection terminal of the semiconductor device 100 is an input terminal, is comprised of an output I/O cell when the associated connection terminal is an output terminal and is comprised of an input/output I/O cell when the associated connection terminal is an input/output terminal. While the I/O circuits 120 are arranged along the peripheral portion of the semiconductor chip 110, the layout location is not limited to this particular one in the first embodiment.

The I/O circuits 120 on the semiconductor chip 110 include at least an input I/O circuit 122 and an output I/O circuit 124. The layout locations of the input I/O circuit 122 and the output I/O circuit 124 are not also limited to the illustrated locations in the first embodiment.

The chip core portion of the semiconductor chip 110 has a basic cell area as a logic circuit block which is so designed as to have desired functions in association with the user specifications in case of, for example, an ASIC, and a plurality of basic cells are connected by a given interconnect layer. A test cell 130 including a delay evaluation circuit is arranged on at least a part of the basic cell area.

The test cell 130 is electrically connected to the input I/O circuit 122 and the output I/O circuit 124 respectively by interconnects 140 and 142 of Al or the like including the given interconnect layer. The test cell 130 may be arranged at an arbitrary location on the semiconductor chip 110 or may be laid in the vicinity of the peripheral portion of the semiconductor chip 110 in consideration of, for example, easier layout design by the user or the delay characteristics.

The test cell 130 includes a first delay circuit (a delay path in a broad sense) 150 comprising a row of plural stages of inverters (buffer circuits in a broad sense), which is a delay element in a broad sense, connected to one another only by, for example, a first interconnect layer, and a delay evaluation switching circuit 152.

Figure 2:
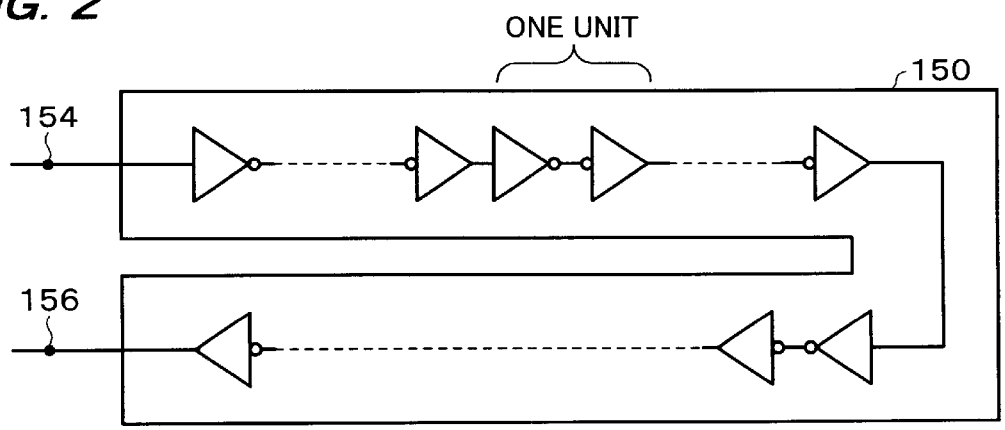
FIG. 2 is an explanatory diagram schematically illustrating the concept of the layout of a first delay circuit according to the first embodiment.

FIG. 2 schematically illustrates the concept of the layout of the first delay circuit 150.

The first delay circuit 150 has a plurality of units, each having two series-connected inverter circuits, connected in a folded manner in such a way that its input section 154 and output section 156 are located close to each other.

The delay evaluation switching circuit 152 can switch two measurement modes from one to the other in response to a measurement switch signal 158 supplied from, for example, a basic cell. The measurement switch signal 158 may be connected to, for example, another input I/O circuit so that it can be directly controlled via the associated connection terminal of the semiconductor device.

In the first one of the two measurement modes that are switched by the measurement switch signal 158, a measurement signal input from the input I/O circuit 122 via the interconnect 140 is output as it is to the output I/O circuit 124 via the interconnect 142. In the second measurement mode, the measurement signal input from the input I/O circuit 122 via the interconnect 140 is input to the first delay circuit 150 shown in FIG. 2 and a delay signal output from the output section of the first delay circuit 150 is output to the output I/O circuit 124 via the interconnect 142.

Figure 3:
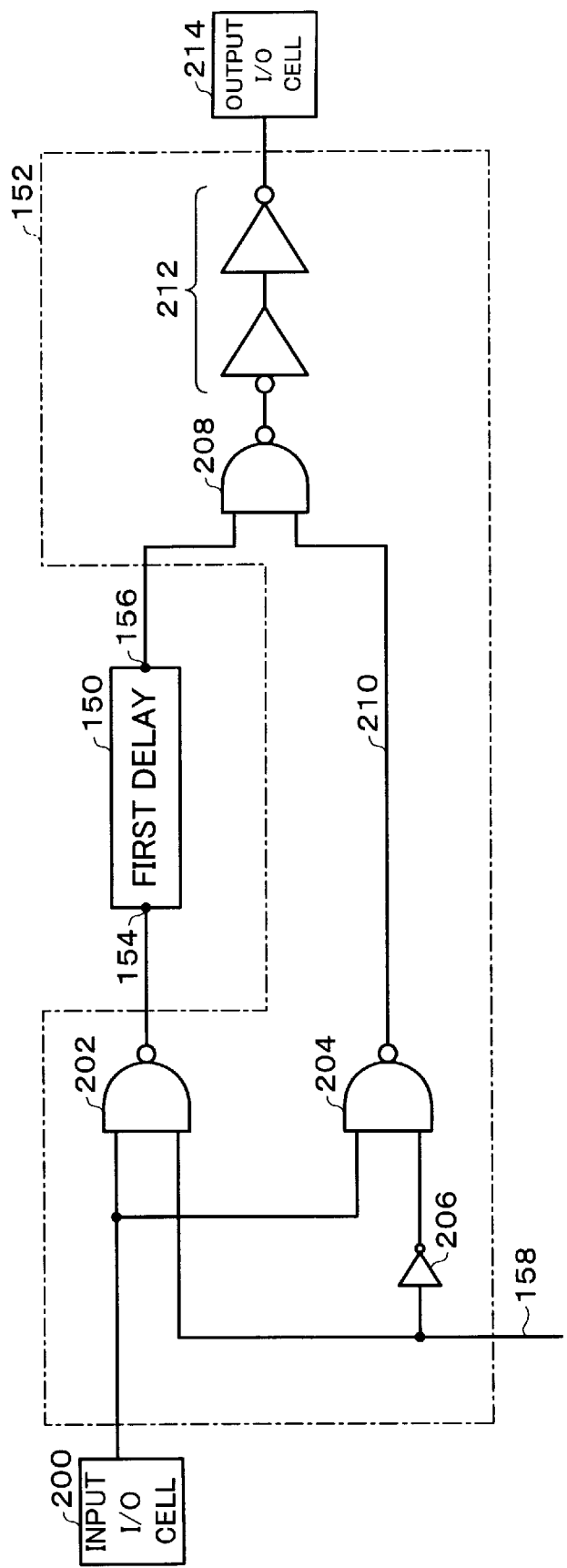
FIG. 3 is a structural diagram schematically showing one example of the structure of a delay evaluation switching circuit according to the first embodiment.

FIG. 3 schematically shows one example of the structure of the delay evaluation switching circuit 152 of the test cell 130 that can switch the path for the measurement signal.

As mentioned above, the test cell 130 includes the first delay circuit 150 and the delay evaluation switching circuit 152. The measurement signal from an input I/O cell 200 included in the input I/O circuit 122 is input to one input terminal of each of 2-input and 1-output NAND gates 202 and 204 in the delay evaluation switching circuit 152. The measurement switch signal 158 is input to the other input terminal of the NAND gate 202. The measurement switch signal 158 is also input to an inverter circuit 206 whose output is connected to the other input terminal of the NAND gate 204. The output of the NAND gate 202 is connected to the input section (input terminal) 154 of the first delay circuit 150.

The outputs of the output section (output terminal) 156 of the first delay circuit 150 and the NAND gate 204 are both input to a 2-input and 1-output NAND gate 208. A path 210 from the output terminal of the NAND gate 204 to one input terminal of the NAND gate 208 forms a so-called through path and is disposed in such a way that the length of the interconnect becomes as short as possible. The output of the NAND gate 208 is connected to an output I/O cell 214 via a driver circuit 212.

In case where the measurement switch signal 158 having a logic level "L" is input to the delay evaluation switching circuit 152 as the first measurement mode, when a pulse signal, for example, is input as the measurement signal from the input I/O cell 200, the output of the NAND gate 202 holds a logic level "H" but the output of the NAND gate 204 changes. The output signal of the NAND gate 204 is input to the NAND gate 208 via the path 210 and is output from the output I/O cell 214.

In case where the measurement switch signal 158 having a logic level "H" is input to the delay evaluation switching circuit 152 as the second measurement mode, on the other hand, when a pulse signal, for example, is input as the measurement signal from the input I/O cell 200, the output of the NAND gate 204 holds a logic level "H" but the output of the NAND gate 202 changes. The output signal of the NAND gate 202 is input to the NAND gate 208 via the first delay circuit 150 and is output from the output I/O cell 214.

As described above, the layout is designed in such a way that the difference between the lengths of the interconnects through which the measurement signal input from the input I/O circuit 122 via the interconnect 140 passes between the first measurement mode and second measurement mode becomes as close to the length of the interconnect of the first delay circuit 150 as possible. That is, with regard to the path 210, the input section and the output section of the first delay circuit 150 are disposed in a folded manner so as to come close to each other and those input section and output section are close to the output section of the delay evaluation switching circuit 152 to the interconnect 142. This layout shortens the path for the measurement signal from the input I/O circuit 122 to be output to the interconnect 142 in the first measurement mode, so that the measuring results in the first measurement mode and second measurement mode are not affected by, for example, the lengths of other interconnects and can depend only on the first delay circuit 150.

Accordingly, the difference between delay times d1 and d2 between the input I/O circuit 122 and the output I/O circuit 124 respectively measured in the first measurement mode and second measurement mode becomes approximate or equal to the delay value of the first delay circuit 150. That is, it is possible to cancel out the delay time that is provided by the input I/O circuit 122, the length of the interconnect 140 and the parasitic capacitor thereof and the delay time that is provided by the length of the interconnect 142, the parasitic capacitor thereof and the output I/O circuit 124. It is also possible to cancel out the inherent influence of the measuring unit that varies the waveform of the measurement signal input to the input I/O circuit 122 and the load capacitor to be added to the output I/O circuit 124.

Figure 4:
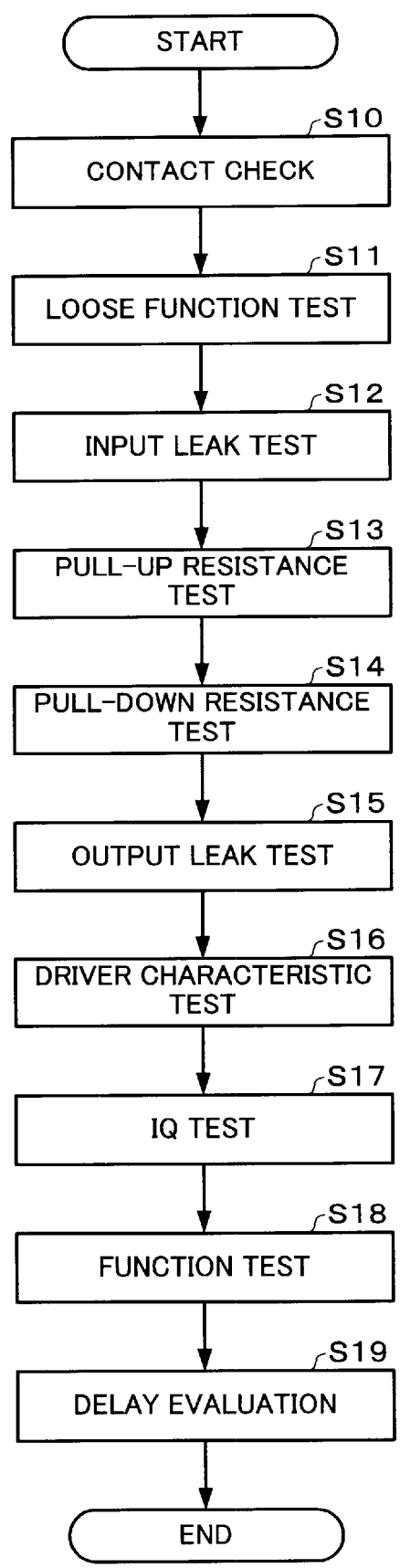
FIG. 4 is a flowchart exemplifying a semiconductor-chip sort-out flow which is adapted to a semiconductor device according to the first embodiment.

FIG. 4 exemplifies a semiconductor-chip sort-out flow which is adapted to the semiconductor device according to the first embodiment.

The illustrated flow is for sorting out a plurality of semiconductor chips which are formed on a wafer in a series of fabrication steps and each include a test cell as shown in FIGS. 2 and 3.

First, a contact check is performed to check whether or not a probe card to be attached to a semiconductor tester is electrically connected to the pads of a chip to be checked (step S10). Specifically, it is checked if all the probes of the probe card which are provided in association with the pads included in the I/O circuits 120 arranged at the peripheral portion of the semiconductor chip are electrically connected to the respective pads of the semiconductor chip.

When it is confirmed that all the probes of the probe card are electrically connected to the respective pads of the semiconductor chip, a loose function test is conducted with a test pattern for performing a simple functional check (step S11). As this step quickly sorts out a defective chip that cannot satisfy the desired specifications due to some factors and checks the next chip, the time to test all the chips on the wafer is shortened.

When the chip is determined as passed in the loose function test, an input leak test is then carried out to test the input driver circuit which constitutes the input I/O cell of each input I/O circuit or the input/output I/O cell of each input/output I/O circuit among a plurality of I/O circuits (step S12). When the chip is determined as failed in the input leak test, the next chip is checked.

Then, a pull-up resistor and a pull-down resistor provided in an input I/O cell, an output I/O cell or an input/output I/O cell are checked (step S13 and step S14). When the chip is determined as failed in each of the tests, the next chip is checked.

Further, an output leak test is executed to test the output driver circuit which constitutes the output I/O cell of each output I/O circuit among a plurality of I/O circuits (step S15). When the chip is determined as failed in the output leak test, the next chip is checked.

Then, electric characteristics, such as the input level and the output level, of the input driver circuit and the output driver circuit, which constitute each input I/O cell, each output I/O cell or each input/output I/O cell, are tested (step S16). When the chip is determined as failed in the electric characteristic test on those driver circuits, the next chip is checked.

Subsequently, it is checked if there is a leak (IQ) current between the power source and GND in order to inspect a failure in transistors that constitute each basic cell on the basic cell area of the chip (step S17). When the chip is determined as failed in the IQ test, the next chip is checked.

When the chip is determined as passed in the IQ test, a function test is executed with a test pattern which can check a lot more functions than done in step S11 (step S18). When the chip is determined as failed in the function test, the next chip is checked.

Then, the delay time between the input I/O circuit and the output I/O circuit is measured and delay evaluation is performed by using the test cell in the first embodiment (step S19). When the chip is determined as failed in the delay evaluation, the next chip is checked.

When the chip is determined as passed in the delay evaluation, the chip undergoes a final check to check if the chip can go through given packaging.

Figure 5:
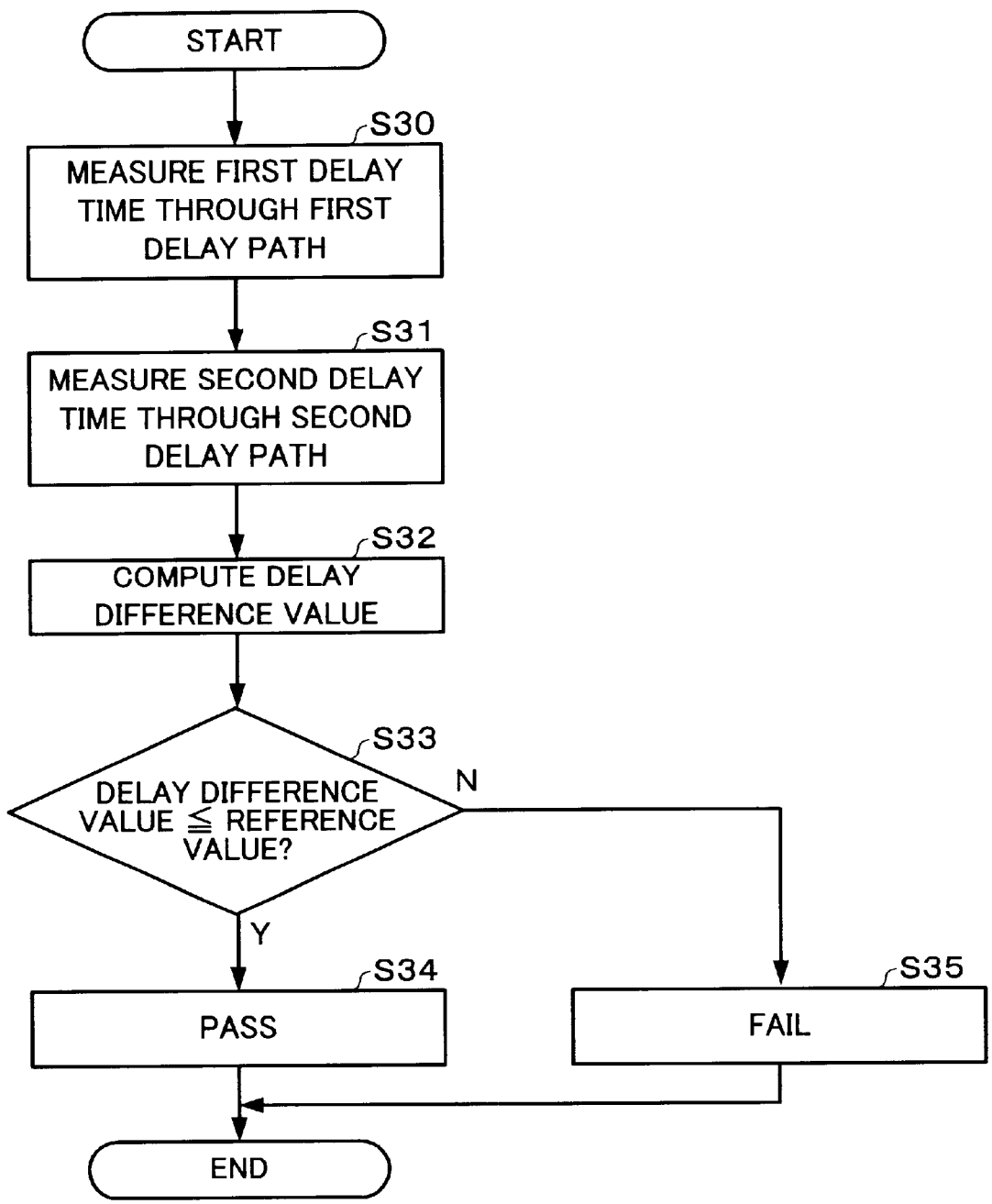
FIG. 5 is a flowchart exemplifying a detailed test flow for delay evaluation according to the first embodiment.

FIG. 5 exemplifies a detailed test flow for the delay evaluation shown in FIG. 4.

It is assumed here that of I/O circuits, the one which is assigned to switch the delay evaluation can be switched between the first and second measurement modes externally.

In the delay evaluation, first, the first measurement mode is specified by the I/O circuit which is assigned to switch the delay evaluation and the first delay time d1 between the input I/O circuit and the output I/O circuit via the through path 210 shown in FIG. 3 is measured (step S30).

Next, the second measurement mode is specified by the I/O circuit which is assigned to switch the delay evaluation and the second delay time d2 between the input I/O circuit and the output I/O circuit via the first delay circuit 150 shown in FIG. 3 is measured (step S31).

Then, "d2−d1" or the difference between first and second delay times d1 and d2 is computed (step S32).

Then, the delay difference value is compared with a predetermined reference value (step S33). The reference value is a so-called sorting value.

When the delay difference value is equal to or smaller than the predetermined reference value (Y in step S33), it is considered that the delay time can be guaranteed and the determination of the passed chip is performed (step S34) after which the sequence of delay evaluation steps is terminated (END).

On the other hand, when the delay difference value is larger than the predetermined reference value (N in step S33), it is considered that the delay time can not be guaranteed due to the cause such as process conditions and the determination of the failed chip is performed (step S35) after which the sequence of delay evaluation steps is terminated (END).

As delay evaluation is carried out based on the difference between the delay times d1 and d2 between the input I/O circuit 122 and the output I/O circuit 124 that are measured respectively in the first and second measurement modes using the first delay circuit 150 and the through path whose interconnection length can be negligible, it is possible to cancel out various factors that affect the measurements, such as the input I/O circuit 122, the output I/O circuit 124, the length of the interconnect 140 connected to the input I/O circuit 122, the parasitic capacitor of the interconnect 140, the length of the interconnect 142 connected to the output I/O circuit 124 and the parasitic capacitor of the interconnect 142. It is also possible to cancel out the inherent influence of the measuring unit that varies the waveform of the measurement signal input to the input I/O circuit 122 and the load capacitor to be added to the output I/O circuit 124.

Comparative Example

To show the advantages of the delay evaluation on a semiconductor device according to the first embodiment that has already been described, the results of the delay evaluation are compared below with the results of delay evaluation on a semiconductor device according to the related art.

Figure 6:
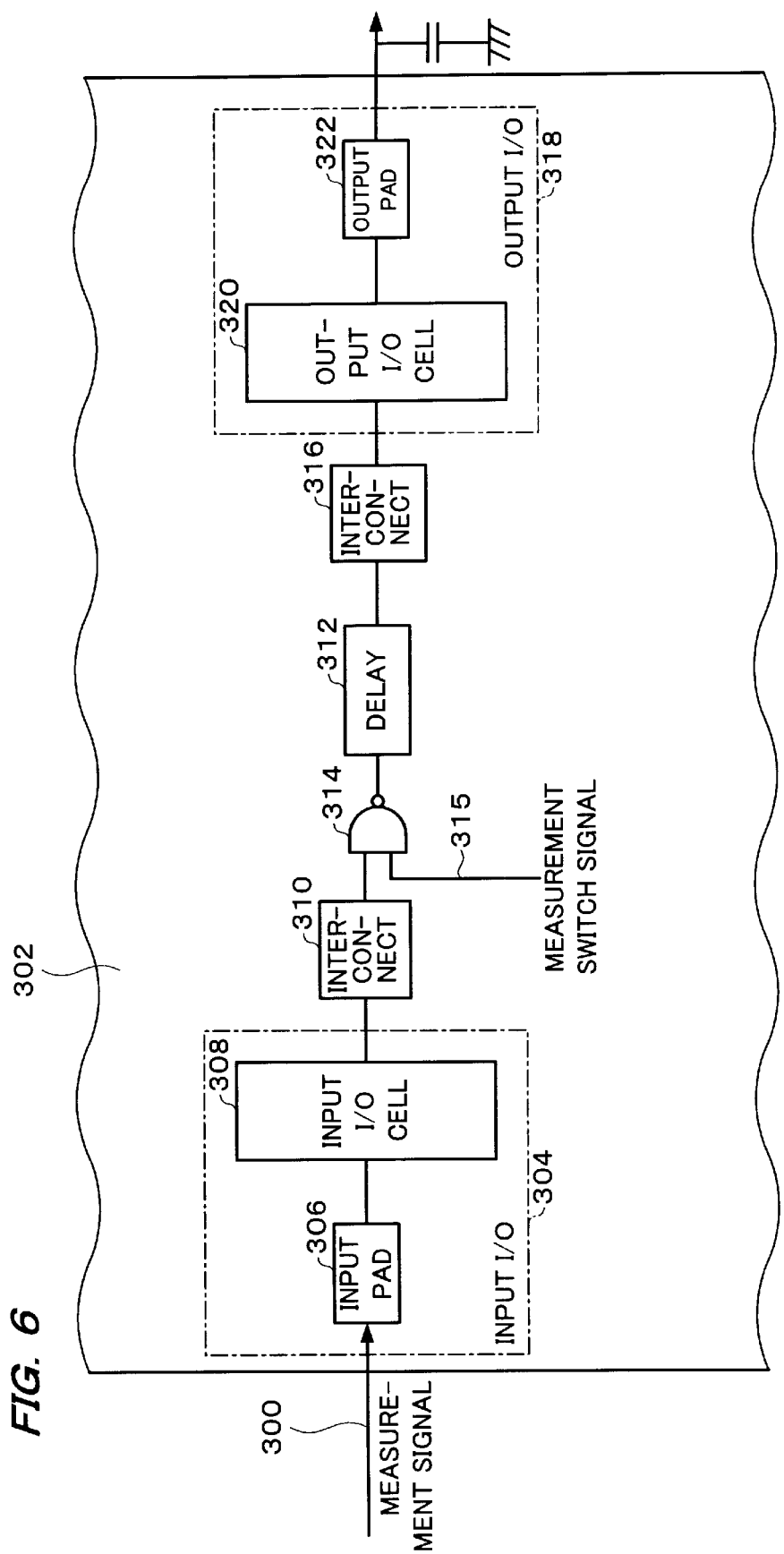
FIG. 6 is an explanatory diagram schematically illustrating the outline of a system for measuring a delay time via a delay evaluation switching circuit included in a semiconductor device according to the related art.

FIG. 6 schematically illustrates the outline of a system for measuring a delay time via a delay evaluation switching circuit included in a semiconductor device according to the related art.

In case where the measuring unit is a semiconductor tester, for example, when a measurement signal 300 generated by the semiconductor tester is supplied to an input pad 306 of an input I/O circuit 304 of a semiconductor chip 302 for measuring a delay, a signal which is electrically interfaced by an input I/O cell 308 is input to a delay circuit 312 via an interconnect 310 of, for example, Al. A NAND gate 314 for turning on or off the delay evaluation function, for example, is inserted before the delay circuit 312, and the delay evaluation function is enabled by a measurement switch signal 315. A delayed signal of the measurement signal 300 which is output from the delay circuit 312 is supplied to an output I/O circuit 318 via an interconnect 316 of, for example, Al. The output signal of the output I/O circuit 318 is enabled by an output I/O cell 320 with respect to the measuring pin of the semiconductor tester connected to an output pad 322.

Figure 7:
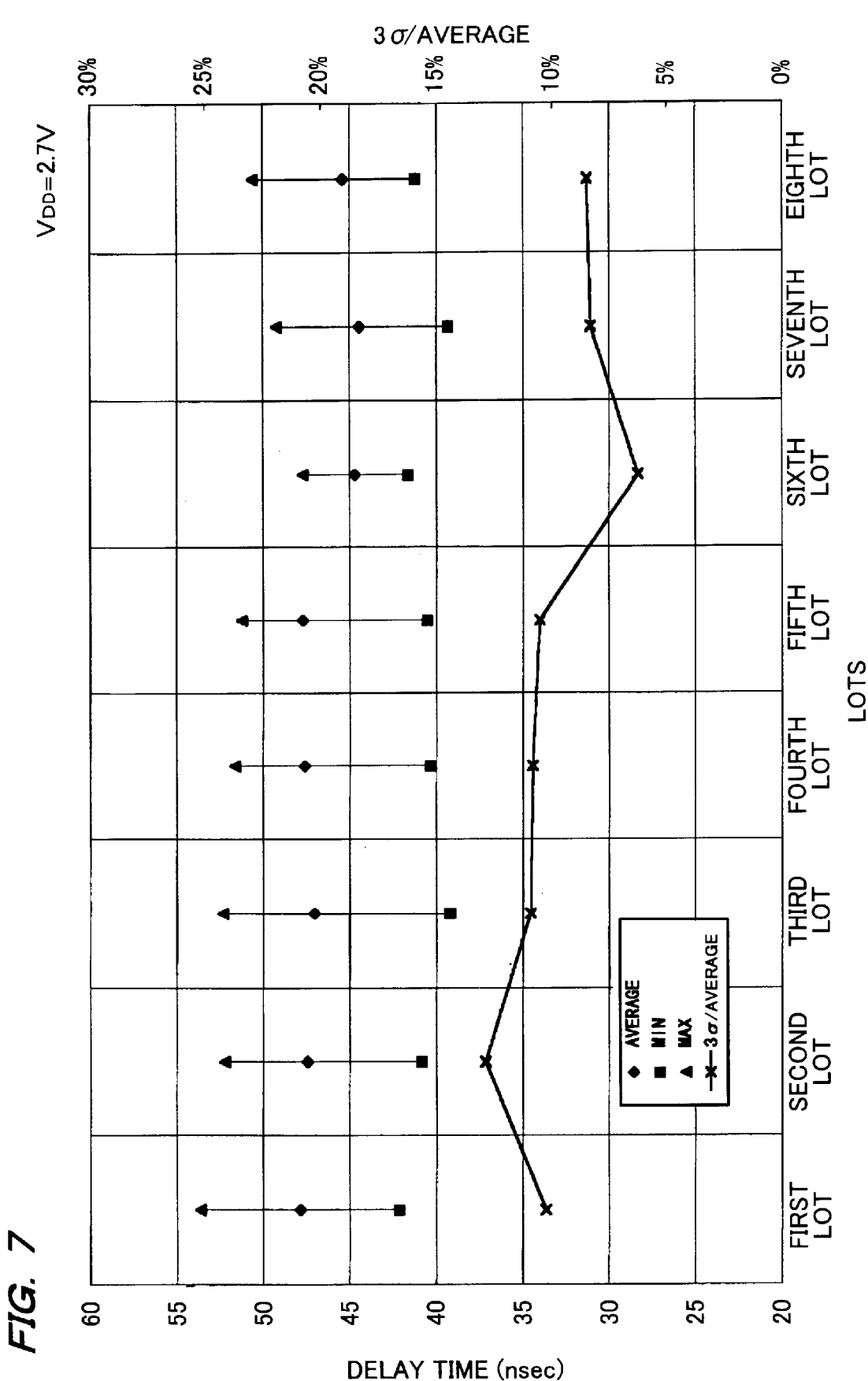
FIG. 7 is an explanatory diagram showing one example of delay measuring results for the semiconductor device according to the related art.

FIG. 7 shows one example of delay measuring results for the semiconductor device according to the related art.

In FIG. 7, delay values measured when a supply voltage $V_{DD}$ is 2.7 volts (V) as one of worst conditions are plotted for chips on each lot of wafers. For each lot, the maximum value (MAX), minimum value (MIN) and average value (AVERAGE) for the measured delay times and 3σ/average are shown. The "3σ/average" indicates the degree of variation.

As apparent from the diagram, in the delay evaluation of the semiconductor device according to the related art, the measured values vary due to an inevitable variation in the fabrication conditions. The delay time to be measured is considerably influenced by variations in the interconnection delays of the interconnects 310 and 316, the input waveform to the measuring unit, the output load and so forth. As a result, "3σ/average" indicating the degree of variation not only becomes as high as about 10% but also varies from one lot to another. This requires that a margin in consideration of those factors should be given to the sorting value, leading to a possibility that some chips which should not be checked as defective may be discriminated as defective depending on a lot.

The following describes the results of the delay evaluation of a semiconductor device according to the first embodiment discussed above.

FIG. 8 shows results of measurements made by a semiconductor tester for each unit of the first delay circuit as adapted to the semiconductor device according to the first embodiment and results of manual measurements.

Because the input waveform, the output load, the interconnection delay, etc. that would bring about a variation in the measuring results from the measuring unit are canceled out at the time of performing delay evaluation on a semiconductor device according to the first embodiment, a variation in "3σ/average" seen in FIG. 7 sample by sample hardly occurs.

What is more, the difference between the measured value of the semiconductor tester as a measuring unit and the value of a manual measurement made with an oscilloscope is as large as a measurement error in the measuring unit.

That is, the measuring result becomes approximately the same as the delay value of the first delay circuit 150 regardless of the factors, such as the input waveform, the output load and the measuring unit.

Therefore, the reliability of the delay time of the delay evaluation switching circuit that is measured at the time of performing delay evaluation is improved. This eliminates the need for adding an unnecessary margin to the sorting value to sort out defective chips in the delay evaluation, so that those chips which should be checked as passed but would have been checked as defective can be discriminated as passed. This can significantly lower the chip fabrication cost.

In addition, by fixing the shape and layout of the test cell 130, it is possible to perform the delay evaluation that does not depend on the length of the interconnect to the test cell 130 or the chip size but depends only on the fabrication process.

Second Embodiment

While the first embodiment can improve the precision of the delay evaluation regardless of the measuring environment, the second embodiment can monitor the influence of interconnects in consideration of the multilayer structure that becomes complicated due to the improvement on the process technology.

The second embodiment is described below referring to FIGS. 9 through 12.

Figure 9:
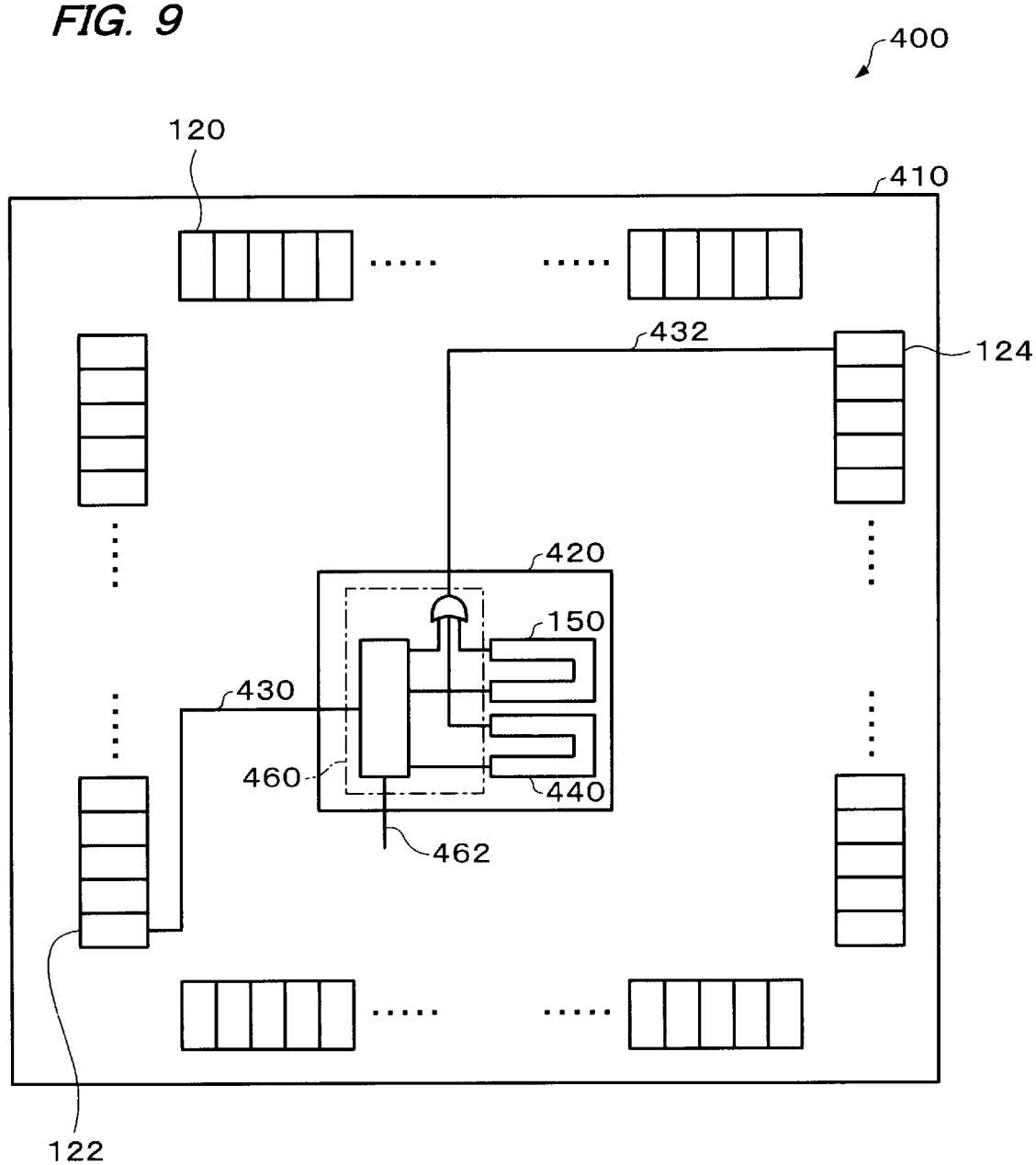
FIG. 9 is an explanatory diagram schematically illustrating one example of the layout of a chip of a semiconductor device according to a second embodiment.

FIG. 9 schematically illustrates one example of the layout of a chip of a semiconductor device according to the second embodiment.

It is to be noted that same reference numerals are given to those components which are the same as the corresponding components of the chip of the semiconductor device according to the first embodiment shown in FIG. 1.

As shown in FIG. 9, a semiconductor device 400 according to the second embodiment includes a semiconductor chip 410 which has circuit elements integrated on a substrate of silicon or the like and unillustrated connection terminals which are to be electrically connected to pads of the semiconductor chip 410.

I/O circuits 120 including pads or electrodes to electrically connect to the unillustrated connection terminals of the semiconductor device 400 and I/O cells having an electric interface capability between the individual pads and basic cells inside the chip are disposed at the peripheral portion of the semiconductor chip 410 in association with those connection terminals.

The I/O circuits 120 on the semiconductor chip 410 include at least an input I/O circuit 122 and an output I/O circuit 124. The layout locations of the input I/O circuit 122 and the output I/O circuit 124 are not also limited to the illustrated locations in the second embodiment.

The chip core portion of the semiconductor chip 410 has a basic cell area as a logic circuit block which is so designed as to have desired functions in association with the user specifications in case of, for example, an ASIC, and a plurality of basic cells are connected by a given interconnect layer. A test cell 420 including a delay evaluation circuit is arranged on at least a part of the basic cell area.

The test cell 420 is electrically connected to the input I/O circuit 122 and the output I/O circuit 124 respectively by interconnects 430 and 432 of Al or the like including the given interconnect layer. The test cell 420 may be arranged at an arbitrary location on the semiconductor chip 410 or may be laid in the vicinity of the peripheral portion of the semiconductor chip 410 in consideration of, for example, easier layout design by the user or the delay characteristics.

The test cell 420 includes a first delay circuit (a delay path in a broad sense) 150 comprising plural stages of inverters (a delay element in a broad sense) connected to one another only by, for example, a first interconnect layer, a second delay circuit 440 comprising plural stages of inverters connected to one another by the first interconnect layer and a second interconnect layer connected to the first interconnect layer by a contact, and a delay evaluation switching circuit 460.

Figure 10:
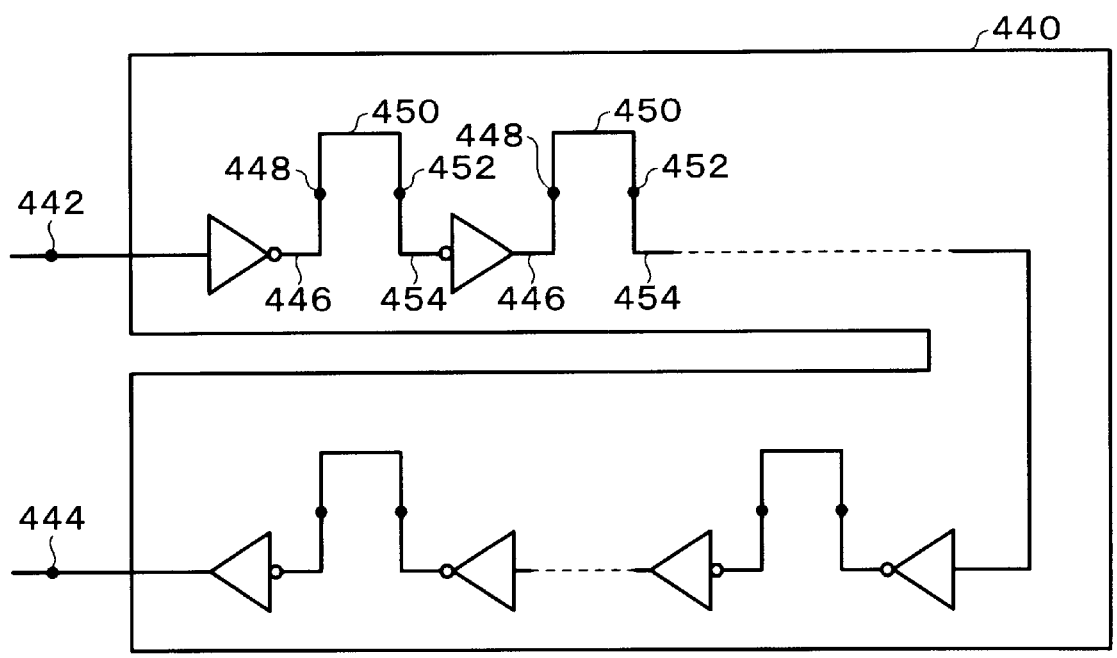
FIG. 10 is an explanatory diagram schematically illustrating the concept of the layout of a first delay circuit according to the second embodiment.

FIG. 10 schematically illustrates the concept of the layout of the second delay circuit 440.

The second delay circuit 440 has a plurality of units, each having two series-connected inverter circuits, connected in a folded manner in such a way that its input section 442 and output section 444 are located close to each other. Adjoining inverters are connected by an interconnect which has a first interconnect layer 446 and a second interconnect layer 450 connected together via a contact 448 and further connected to a first interconnect layer 454 via a contact 452.

Therefore, the second delay circuit 440 has two contacts and the second interconnect layer added between inverters in the first delay circuit 150. By comparing the delay value provided by the first delay circuit 150 with the delay value provided by the second delay circuit 440, therefore, the influence of an interconnect layer overlying the first interconnect layer can be monitored quantitatively. This can facilitate the process monitoring and can feed the influence back to the process control.

Controlling the delay value unit by unit makes it unnecessary to set the number of stages of the inverters in the first delay circuit 150 equal to the number of stages of the inverters in the second delay circuit 440.

The delay evaluation switching circuit 460 can switch three measurement modes from one to another in response to a measurement switch signal 462 supplied from, for example, a basic cell. The measurement switch signal 462 may be connected to, for example, another input I/O circuit so that it can be directly controlled via the associated connection terminal of the semiconductor device.

As the first and second ones of the three measurement modes that are switched by the measurement switch signal 462 are the same as those of the first embodiment, their descriptions will not be given. In the third measurement mode in the second embodiment, a measurement signal input from the input I/O circuit 122 via the interconnect 430 is input to the second delay circuit 440 shown in FIG. 10 and a delay signal output from the output section of the second delay circuit 440 is output to the output I/O circuit 124 via the interconnect 432.

Figure 11:
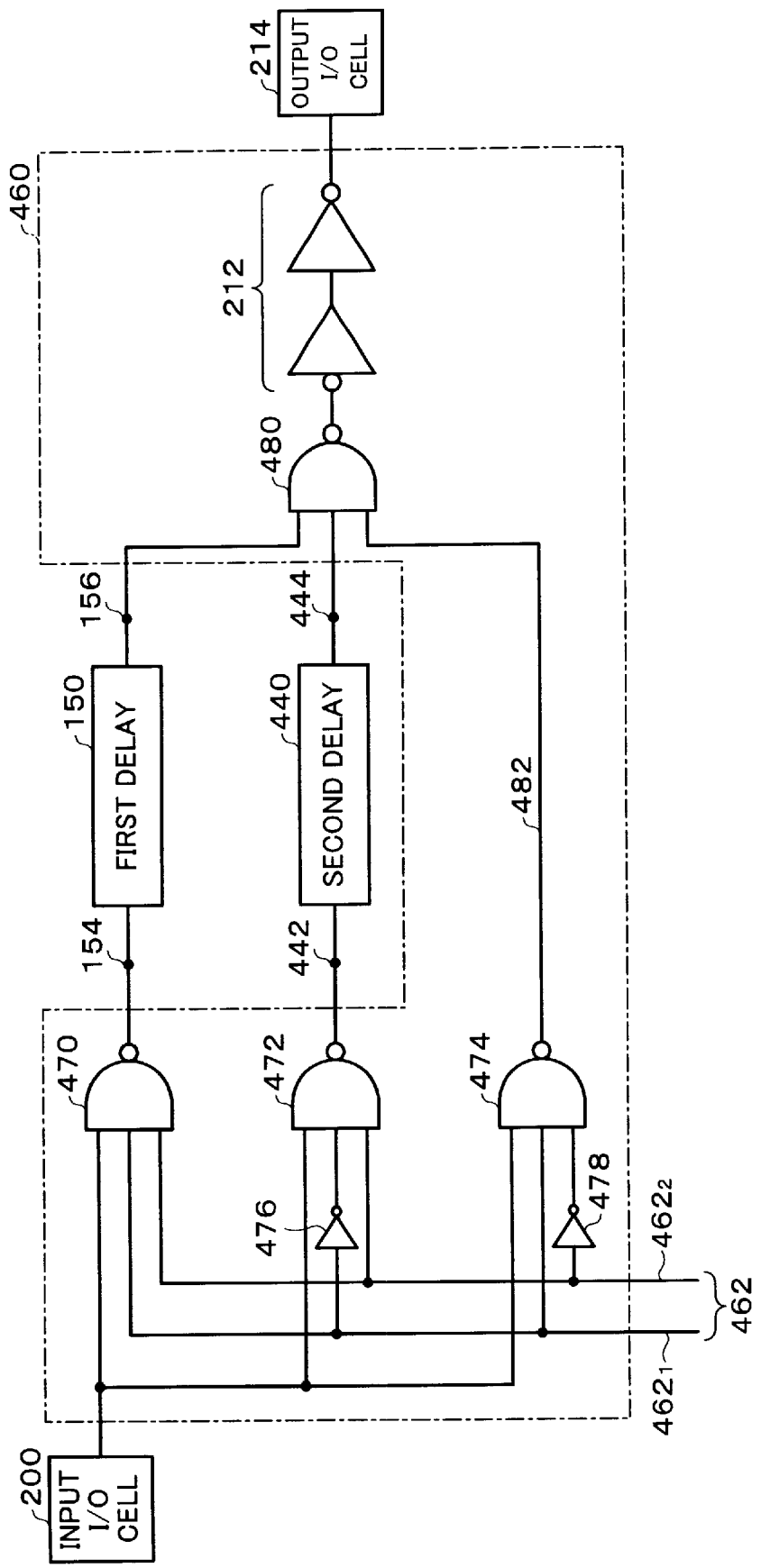
FIG. 11 is a structural diagram schematically showing one example of the structure of a delay evaluation switching circuit according to the second embodiment.

FIG. 11 schematically shows one example of the structure of the delay evaluation switching circuit 460 of the test cell 420 that can switch the path for the measurement signal.

As mentioned above, the test cell 420 includes the first and second delay circuits 150 and 440 and the delay evaluation switching circuit 460. The measurement signal from an input I/O cell 200 included in the input I/O circuit 122 is input to the first input terminal of each of 3-input and 1-output NAND gates 470, 472 and 474 in the delay evaluation switching circuit 460. A measurement switch signal $462_1$ of the first bit of the measurement switch signal 462 having a 2-bit structure is input to the second input terminals of the NAND gates 470 and 474. The measurement switch signal $462_1$ is also input to an inverter circuit 476 whose output is connected to the second input terminal of the NAND gate 472. A measurement switch signal $462_2$ of the second bit of the measurement switch signal 462 having a 2-bit structure is input to the third input terminals of the NAND gates 470 and 472. The measurement switch signal $462_2$ is also input to an inverter circuit 478 whose output is connected to the third input terminal of the NAND gate 474.

The output of the NAND gate 470 is connected to the input section (input terminal) 154 of the first delay circuit 150. The output of the NAND gate 472 is connected to the input section (input terminal) 442 of the second delay circuit 440.

The outputs of the output section (output terminal) 156 of the first delay circuit 150, the output section (output terminal) 444 of the second delay circuit 440 and the NAND gate 474 are both input to a 3-input and 1-output NAND gate 480. A path 482 from the output terminal of the NAND gate 474 to the third input terminal of the NAND gate 480 forms a so-called through path and is disposed in such a way that the length of the interconnect becomes as short as possible. The output of the NAND gate 480 is connected to an output I/O cell 214 via a driver circuit 212.

In case where the measurement switch signal $462_1$ having a logic level "H" and the measurement switch signal $462_2$ having a logic level "L" are input to the delay evaluation switching circuit 460 as the first measurement mode, when a pulse signal, for example, is input as the measurement signal from the input I/O cell 200, the outputs of the NAND gates 470 and 472 stay at a logic level "H" but the output of the NAND gate 474 changes. The output signal of the NAND gate 474 is input to the NAND gate 480 via the path 482 and is output from the output I/O cell 214.

In case where the measurement switch signal $462_1$ having the logic level "H" and the measurement switch signal $462_2$ having a logic level "H" are input to the delay evaluation switching circuit 460 as the second measurement mode, when a pulse signal, for example, is input as the measurement signal from the input I/O cell 200, the outputs of the NAND gates 472 and 474 stay at a logic level "H" but the output of the NAND gate 470 changes. The output signal of the NAND gate 470 is input to the NAND gate 480 via the first delay circuit 150 and is output from the output I/O cell 214.

In case where the measurement switch signal $462_1$ having a logic level "L" and the measurement switch signal $462_2$ having the logic level "H" are input to the delay evaluation switching circuit 460 as the third measurement mode, when a pulse signal, for example, is input as the measurement signal from the input I/O cell 200, the outputs of the NAND gates 470 and 474 stay at a logic level "H" but the output of the NAND gate 472 changes. The output signal of the NAND gate 472 is input to the NAND gate 480 via the second delay circuit 440 and is output from the output I/O cell 214.

As described above, the layout is designed in such a way that the difference between the lengths of the interconnects through which the measurement signal input from the input I/O circuit 122 via the interconnect 430 passes between the first measurement mode and second measurement mode becomes as close to the length of the interconnect of the first delay circuit 150 as possible, as per the first embodiment.

According to the second embodiment, as the input section and the output section of the second delay circuit 440 are arranged close to each other and are arranged in the vicinity of the input section and output section of the first delay circuit 150, the difference between the first and second delay circuits 150 and 440 through which the measurement signal passes between the second measurement mode and the third measurement mode is made equal to the contact and the second interconnect layer (particularly its thickness).

Accordingly, in addition to the effect of canceling out the delay value in the first embodiment, the second embodiment has an effect of making the difference between delay times d2 and d3 between the input I/O circuit 122 and the output I/O circuit 124 respectively measured in the second measurement mode and third measurement mode equal to the delay value that is produced by the influence of the factors, such as the contact and the thickness of the second interconnect layer. That is, it is possible to measure only the influence of the delay time provided by the resistance of the contact which electrically connects the first and second interconnect layers, the length of the second interconnect layer and the parasitic capacitor thereof.

According to the second embodiment, the influence of a layer overlying the first interconnect layer can also be monitored by executing delay evaluation, which will be discussed below, in the sort-out flow shown in FIG. 4.

Figure 12:
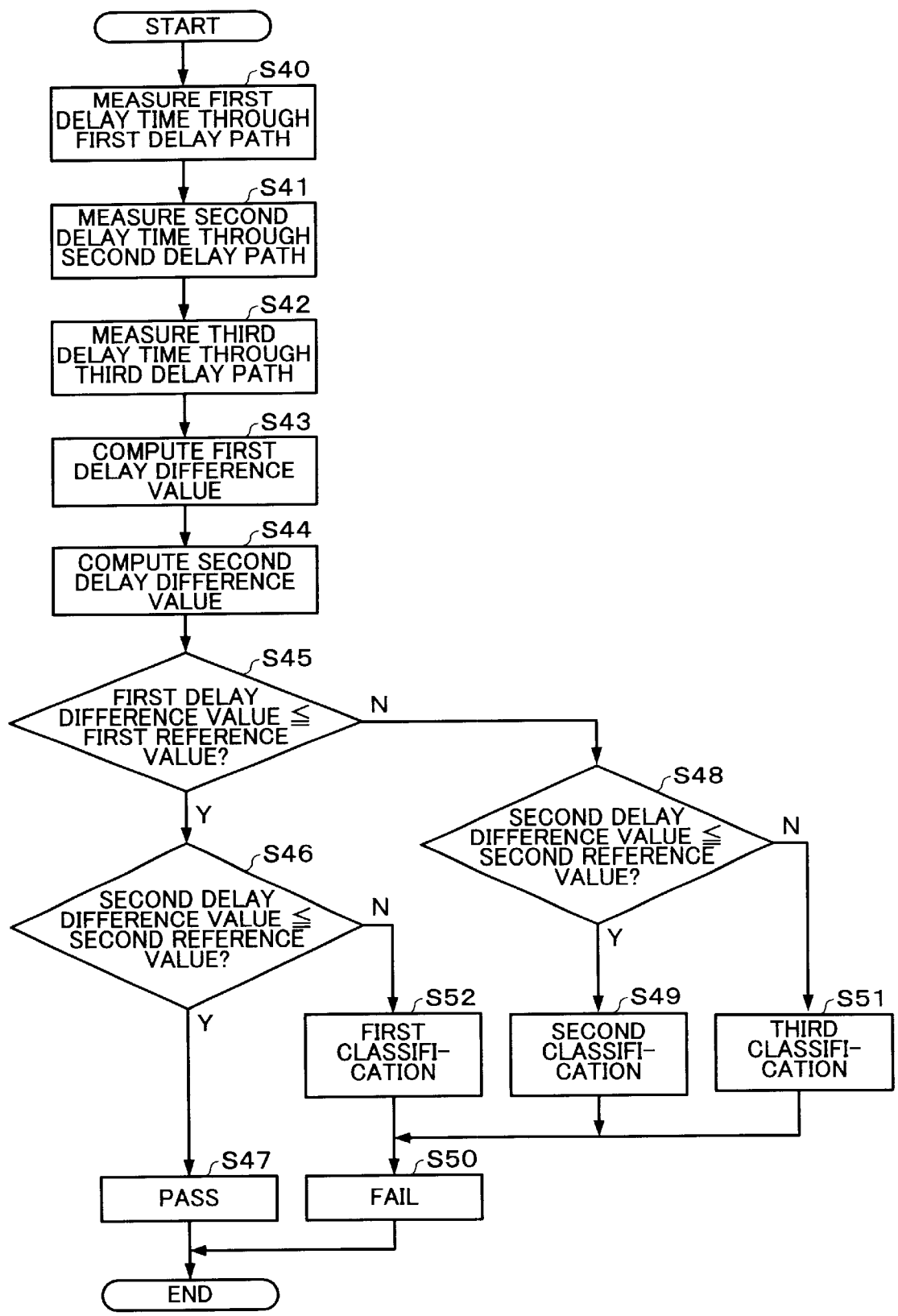
FIG. 12 is a flowchart exemplifying a detailed test flow for delay evaluation on a semiconductor chip of the semiconductor device according to the second embodiment.

FIG. 12 exemplifies a detailed test flow for the delay evaluation on the semiconductor chip of the semiconductor device according to the second embodiment.

It is assumed here that two of I/O circuits, which are assigned to switch the delay evaluation, can be switched to one of the first to third measurement modes externally.

In the delay evaluation, first, the first measurement mode is specified by the I/O circuit which is assigned to switch the delay evaluation and the first delay time d1 between the input I/O circuit and the output I/O circuit via the through path 482 shown in FIG. 11 is measured (step S40).

Next, the second measurement mode is specified by the I/O circuits which are assigned to switch the delay evaluation and the second delay time d2 between the input I/O circuit and the output I/O circuit via the first delay circuit 150 shown in FIG. 11 is measured (step S41).

Further, the third measurement mode is specified by the I/O circuits which are assigned to switch the delay evaluation and the third delay time d3 between the input I/O circuit and the output I/O circuit via the second delay circuit 440 shown in FIG. 11 is measured (step S42).

Then, a first delay difference value "d2–d1" or the difference between the first and second delay times d1 and d2 is computed (step S43).

Further, a second delay difference value "d3–d2" or the difference between the second and third delay times d2 and d3 is computed (step S44).

Then, the first delay difference value is compared with a predetermined first reference value (step S45). The first reference value is one of so-called sorting values.

When the first delay difference value is equal to or smaller than the predetermined first reference value (Y in step S45), the second delay difference value is compared with a predetermined second reference value (step S46). The second reference value is also one of the so-called sorting values.

When the second delay difference value is equal to or smaller than the predetermined second reference value (Y in step S46), it is considered that the delay time provided by the first and second interconnect layers can be guaranteed and the determination of the passed chip is performed (step S47) after which the sequence of delay evaluation steps is terminated (END).

When the first delay difference value is greater than the predetermined first reference value in step S45 (N in step S45), the second delay difference value is compared with the predetermined second reference value (step S48).

When the second delay difference value is equal to or smaller than the predetermined second reference value (Y in step S48), the chip is discriminated as a defective chip of the second classification such that while the delay time cannot be guaranteed any more, there is no influence of a layer overlying the first interconnect layer (step S49 and step S50). Then, the sequence of delay evaluation steps is terminated (END).

When the second delay difference value is greater than the predetermined second reference value in step S48 (N in step S48), the chip is discriminated as a defective chip of the third classification such that the delay time cannot be guaranteed any more and there is some kind of failure in a layer overlying the first interconnect layer (step S51 and step S50). Then, the sequence of delay evaluation steps is terminated (END).

When the second delay difference value is greater than the predetermined second reference value in step S46 (N in step S46), the chip is discriminated as a defective chip of the first classification such that while the delay time provided by the first interconnect layer can be guaranteed, there is some kind of failure in a layer overlying the first interconnect layer (step S52 and step S50). Then, the sequence of delay evaluation steps is terminated (END).

Because the second embodiment has a capability of easily monitoring the influence of an interconnect layer overlying a given interconnect layer in addition to the effect of the first embodiment, it is possible to facilitate the analysis on whether the factor leading to, for example, discrimination of the semiconductor device as defective lies in the chip or in the process. Further, feedback of the monitoring results to the process control can improve the yield of chips under stable fabrication conditions.

The present invention is not limited to the first and second embodiments, but may be modified in various forms within the scope of the present invention.

Although the foregoing description of the first and second embodiments has been given of the case where two or three delay paths are provided, the present invention is not limited to those particular cases. Delay evaluation may be likewise performed with four or more delay paths provided. The present invention can take any structure as long as a plurality of delay paths are provided and a delay value can be evaluated based on the difference between delay times provided via any two of the delay paths.

Although delay evaluation on semiconductor chips of semiconductor devices is executed in the first and second embodiments, the present invention can be adapted to the case where a semiconductor chip is considered as the same as a semiconductor device.

Although the description of the second embodiment has been given of the case of only the second interconnect layer overlying the first interconnect layer, the same is applied to the case where a plurality of interconnect layers are provided over the first interconnect layer.

What is claimed is:

1. A semiconductor device including a test cell for performing delay evaluation of a signal input from a first I/O circuit and output to a second I/O circuit, the semiconductor device comprising:

first to N-th delay paths for respectively delaying a signal input from the first I/O circuit by first to N-th delay values different from one another and for outputting the delayed signal to the second I/O circuit;

a delay path switching circuit that selects one of the first to N-th delay paths through which a signal input from the first I/O circuit is output to the second I/O circuit, wherein an i-th delay path ("i" being a natural number equal to or greater that 1 and equal to or smaller that N) includes a delay element which is disposed in such a manner that an input section and an output section of the delay element are positioned close to each other.

2. The semiconductor device according to claim 1, wherein the i-th delay path ("i" being a natural number equal to or greater that 1 and equal to or smaller that N) includes the delay element and a given interconnect layer, and wherein a j-th delay path ("j" being a natural number equal to or greater than 1 and equal to or smaller than N but excluding i) does not include a delay element but includes the given interconnect layer.

3. The semiconductor device according to claim 2, wherein a k-th delay path ("k" being a natural number equal to or greater than 1 and equal to or smaller than N but excluding i and j) comprises a delay element that includes at least a plurality of interconnect layers including the given interconnect layer, and a contact for electrically connecting the plurality of interconnect layers.

4. The semiconductor device according to claim 1, wherein a k-th delay path ("k" being a natural number equal to or greater than 1 and equal to or smaller than N but excluding i and j) comprises a delay element that includes at least a plurality of interconnect layers including the given interconnect layer, and a contact for electrically connecting the plurality of interconnect layers.

5. The semiconductor device according to claim 3, wherein the k-th delay path is disposed in such a manner that an input section and an output section of the delay element are positioned close to each other.

6. The semiconductor device according to claim 4, wherein the k-th delay path is disposed in such a manner that an input section and an output section of the delay element are positioned close to each other.

7. The semiconductor device according to claim 2, wherein the delay element includes first to M-th buffer circuits and is disposed in such a manner that an m-th buffer circuit (m being a natural number equal to or greater than 1 and equal to or smaller than (M−1)) is connected to an (m+1)-th buffer circuit and an input section of the first buffer circuit and an output section of the M-th buffer circuit are positioned close to each other.

8. A test method for a semiconductor device including first and second I/O circuits and first to N-th delay paths, which are provided between the first and second I/O circuits, for respectively delaying a signal by first to N-th delay values different from one another, the method comprising steps of:

measuring first to N-th delay times between a signal input from the first I/O circuit and a signal output to the second I/O circuit being output via each of the first to N-th delay paths corresponding to the input signal for each of the first to N-th delay paths; and testing the semiconductor device based on a difference between at least two of the first to N-th delay times.

9. The test method according to claim 8, wherein an i-th delay path ("i" being a natural number equal to or greater than 1 and equal to or smaller than N) includes a delay element and a given interconnect layer, and wherein a j-th delay path ("j" being a natural number equal to or greater than 1 and equal to or smaller than N but excluding i) does not include a delay element but includes the given interconnect layer.

10. The test method according to claim 9, wherein the i-th delay path is disposed in such a manner that an input section and an output section of the delay element are positioned close to each other.

11. The test method according to claim 9, wherein a k-th delay path ("k" being a natural number equal to or greater than 1 and equal to or smaller than N but excluding i and j) comprises a delay element that includes at least a plurality of interconnect layers including the given interconnect layer, and a contact for electrically connecting the plurality of interconnect layers.

12. The test method according to claim 10, wherein a k-th delay path ("k" being a natural number equal to or greater than 1 and equal to or smaller than N but excluding i and j) comprises a delay element that includes at least a plurality of interconnect layers including the given interconnect layer, and a contact for electrically connecting the plurality of interconnect layers.

13. The test method according to claim 11, wherein the k-th delay path is disposed in such a manner that an input section and an output section of the delay element are positioned close to each other.

14. The test method according to claim 12, wherein the k-th delay path is disposed in such a manner that an input section and an output section of the delay element are positioned close to each other.

15. The test method according to claim 9, wherein the delay element includes first to M-th buffer circuits and is disposed in such a manner that an m-th buffer circuit (m being a natural number equal to or greater than 1 and equal to or smaller than (M−1)) is connected to an (m+1)-th buffer circuit and an input section of the first buffer circuit and an output section of the M-th buffer circuit are positioned close to each other.

* * * * *